(12) United States Patent
Omura et al.

(10) Patent No.: US 9,105,584 B2
(45) Date of Patent: Aug. 11, 2015

(54) METHOD OF MANUFACTURING A SEMICONDUCTOR DEVICE

(71) Applicant: KABUSHIKI KAISHA TOSHIBA, Tokyo (JP)

(72) Inventors: Mitsuhiro Omura, Mie-ken (JP); Toshiyuki Sasaki, Mie-ken (JP); Tsubasa Imamura, Mie-ken (JP); Kazuhisa Matsuda, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/147,360

(22) Filed: Jan. 3, 2014

(65) Prior Publication Data

US 2015/0064913 A1    Mar. 5, 2015

(30) Foreign Application Priority Data

Sep. 2, 2013    (JP) ................. 2013-181636

(51) Int. Cl.
*H01L 21/311* (2006.01)
*H01L 21/308* (2006.01)
*H01L 21/3065* (2006.01)

(52) U.S. Cl.
CPC ........ *H01L 21/3088* (2013.01); *H01L 21/3065* (2013.01); *H01L 21/3086* (2013.01)

(58) Field of Classification Search
CPC ............ H01L 21/3065; H01L 21/3086; H01L 21/3088
USPC ................. 438/696, 700–706, 717–719, 725, 438/734–738
See application file for complete search history.

(56) References Cited

U.S. PATENT DOCUMENTS

| 6,110,834 | A | 8/2000 | Kinoshita et al. |
| 7,253,118 | B2 | 8/2007 | Tran et al. |
| 7,576,010 | B2* | 8/2009 | Lee et al. ...................... 438/717 |
| 8,309,469 | B2 | 11/2012 | Kajiwara |
| 2006/0211260 | A1 | 9/2006 | Tran et al. |
| 2008/0305636 | A1 | 12/2008 | Kim et al. |
| 2009/0047788 | A1 | 2/2009 | Jung |
| 2009/0298274 | A1* | 12/2009 | Kajiwara ...................... 438/591 |
| 2010/0041235 | A1* | 2/2010 | Hashimoto et al. ........... 438/703 |
| 2012/0222813 | A1* | 9/2012 | Pal et al. .................. 156/345.31 |

FOREIGN PATENT DOCUMENTS

JP    H05-144779    6/1993

* cited by examiner

*Primary Examiner* — Duy Deo
*Assistant Examiner* — Maki Angadi
(74) *Attorney, Agent, or Firm* — Patterson & Sheridan, LLP

(57) ABSTRACT

According to one embodiment, a method of manufacturing a semiconductor device includes forming a first line pattern comprising a first film above an underlying layer, depositing a second film on a sidewall and a top surface of the first line pattern of the first film, etching the second film to eliminate the second film on the top surface of the first line pattern of the first film and leave the second film on the sidewall of the first line pattern of the first film, and removing the first line pattern to form a second line pattern of the second film above the underlying layer. The depositing the second film, etching the second film, and removing the first line pattern are sequentially performed within the same plasma processing device.

20 Claims, 8 Drawing Sheets

METHOD OF MANUFACTURING A SEMICONDUCTOR DEVICE

CROSS-REFERENCE TO RELATED APPLICATION

This application is based upon and claims the benefit of priority from Japanese Patent Application No. 2013-181636, filed Sep. 2, 2013, the entire contents of which are incorporated herein by reference.

FIELD

Embodiments described herein relate generally to a method of manufacturing a semiconductor device.

BACKGROUND

In the progression of semiconductor device miniaturization, there is a desire to form a fine pattern that is smaller than the resolution limit of lithography using an aligner or stepper. As a method of realizing this miniaturization, a so-called sidewall transfer process is known, where a sidewall film (spacer film) is formed on the sidewalls of a feature in the core film formed by lithographic techniques, and the core film is removed to leave the sidewall film that is used as a mask in order to process the underlying layer.

According to this method, a line and space pattern with a half pitch of the pitch limit of the lithography resolution can be formed. Further repetition of the sidewall transfer process enables a line and space pattern with a further finer pitch such as ¼ and ⅛ of the pitch limit of the lithography resolution.

However, in the process of forming such a sidewall film mask, to process a wafer to form the sidewall mask, the wafer must be moved among a plurality of independent devices, such as a film formation device, for conformably forming a sidewall film on the exposed surface of the core film, a dry etching device for performing a dry etch process on the thin film layer to etch back the sidewall film on the top surface of the core film to eliminate the same, and a wet etching device for removing the core film. Therefore, the process of forming a sidewall film mask becomes complicated and is costly.

DETAILED DESCRIPTION

Figure 1A:
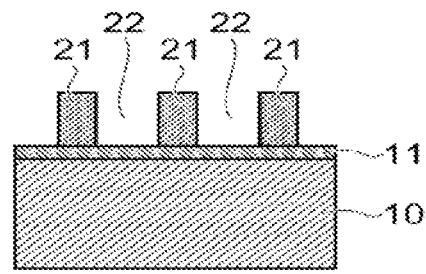
FIGS. 1A to 2D are schematic cross-sectional views showing a method of forming a semiconductor device according to a first embodiment.

According to one embodiment, a method of manufacturing a semiconductor device includes forming a first line pattern comprising a first film above an underlying layer, depositing a second film on a sidewall and a top surface of the first line pattern of the first film, etching the second film to eliminate the second film on the top surface of the first line pattern of the first film and leave the second film on the sidewall of the first line pattern of the first film, and removing the first line pattern to form a second line pattern of the second film above the underlying layer. The depositing of the second film, etching of the second film, and removing of the first line pattern are sequentially performed within the same plasma processing device.

Hereinafter, embodiments will be described referring to the drawings. In the drawings, the same reference numerals are attached to the same elements and duplicate explanations of the elements will not be repeated for brevity.

First Embodiment

FIG. 1A to FIG. 2D are schematic cross-sectional views showing a method of manufacturing a semiconductor device according to a first embodiment.

As illustrated in FIG. 1A, an underlying layer 11 (base layer) is formed on a film 10 to be processed, i.e., etched using the sidewall mask layer to be formed thereon using the underlying layer as a sacrificial template to make the mask. The film 10 to be processed is a semiconductor film, an insulating film, or a metal film formed on a substrate (not shown). Alternatively, the substrate itself is the film 10 to be processed.

The underlying layer 11 is formed on the entire surface of the film 10 to be processed. The underlying layer 11 is a different film from that of the film 10 to be processed, for example, a silicon nitride film. The underlying layer 11 works as an etch stop film as described below.

On the underlying layer 11, a line and space pattern, including a plurality of lines of first film 21, is formed by patterning as shown in FIG. 1A. The lines of the first film 21 extend in the depth direction with respect to the paper surface (into or out of the page). A width of a space 22 between the lines of the patterned first film 21 is wider than the width of the line of the patterned first film 21. Here, width means a width in a direction orthogonal to the extending direction of the line and space pattern and, indicates a width in a horizontal direction in the cross-section of the drawings.

The first film 21 is an organic film including carbon, such as a resist film that is photosensitive. To form the structure of FIG. 1A, a wafer having the stacked structure, including the film 10 to be processed and the underlying layer 11, is transferred into a coater, where the first film 21 (resist film) is formed on the entire surface of the underlying layer 11 by a spin coating.

Next, the wafer is transferred to an aligner and a pattern (latent image) is transferred to the first film 21 by exposure of the first film 21 using a reticle.

Then, the wafer is transferred to a developing device, where the first film 21 is developed. According to the development, the first film 21 is processed into a line and space pattern of FIG. 1A. The pattern size, i.e., the smallest size of the etched or remaining portion of the first film 21, is restricted by the resolution limit of the aligner.

Hereafter, the process of forming a sidewall film mask (sidewall process) will be explained. According to the embodiment, a series of sidewall processes is sequentially performed within the same plasma processor. The wafer transferred into the plasma processor following formation of the patterned line features of FIG. 1A is subjected to a series of processing steps described below, without transfer thereof out of the plasma processor, specifically without exposing the wafer to the air, under a desired decompressed atmosphere.

Figure 7:
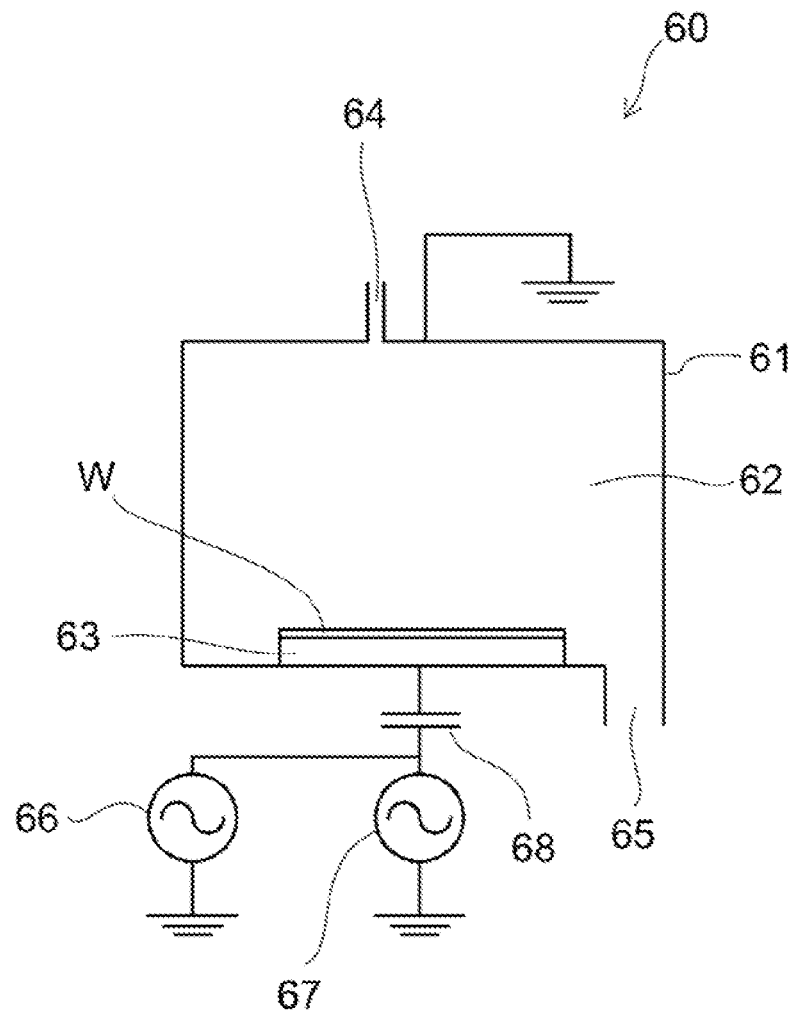
FIG. 7 is a schematic cross-sectional view showing a manufacturing device for manufacturing a semiconductor device according to embodiments described herein.

FIG. 7 is a schematic view of one example of a plasma processor 60 which performs the sidewall process according to the embodiment.

A supporting base 63, for example, an electrostatic chuck is provided in the bottom portion within a chamber 62. A process target wafer W is supported on the supporting base 63.

A gas introducing port 64 is formed on the top of the chamber 62. An exhaust port 65 is formed in the bottom of the chamber 62. Control of the flow of gas from the gas introducing port 64 and the flow of exhaust at the exhaust port 65 maintains a desired pressure inside of the chamber 62.

A chamber wall 61 is grounded. A high frequency power source 66 and a high frequency power source 67 are connected to the supporting base 63 through a blocking capacitor 68. For example, the high frequency power source 66 can apply a power of 100 MHz to the supporting base 63 (wafer W), and the high frequency power source 67 can apply a power of 13.56 MHz to the supporting base 63 (wafer W).

Further, a self-bias voltage Vdc can be applied to the wafer W through the blocking capacitor 68.

In the plasma processor 60, energy is provided to the gas introduced into the chamber 62 to excite the gas and generate a plasma including ions and radicals within the chamber 62.

According to the plasma processor 60 of the embodiment, a desired gas is introduced into the chamber 62 from the gas introducing port 64. Then, by applying the power (electromagnetic energy) from the high frequency power sources 66 and 67 to the supporting base 63, electrical discharge is generated within the chamber 62 to convert the gas into plasma.

When the sidewall film is deposited in the sidewall process described below, the high frequency power source 66 is mainly used to generate plasma. According to this, a film material can be deposited efficiently. When the high frequency power source 67 is used, it is set at a power less than a power of the high frequency power source 66 (when the high frequency power source 66 is used).

Further, in the etching (etch back), in addition to the power of 100 MHz of the high frequency power source 66, the power of 13.56 MHz of the high frequency power source 67 is applied to the wafer W, to generate a self-bias voltage Vdc higher than that at a film deposition on the surface of the wafer W. The function of ions accelerated toward the side of the wafer W is more robust and the etching proceeds with a desired orientation.

After forming the line and space pattern of the first film (resist film) 21 as illustrated in FIG. 1A, the wafer is transferred into the chamber 62 of the plasma processor 60 and mounted on the supporting base 63.

Figure 1B:
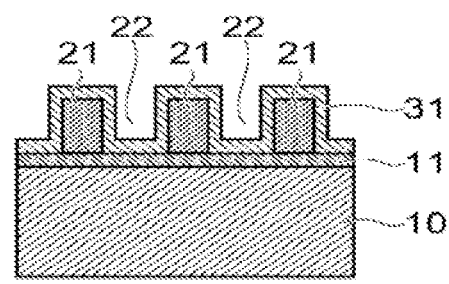

A second film 31 is deposited on the wafer W while the wafer W is in the chamber 62 of the plasma processor 60. The second film 31 is deposited on the top surface to conform to the top surface of the underlying layer 11, and the sidewall and the top surface of the first film 21. The film thickness of the second film 31 is less than the width of the line pattern of the first film 21 and the space 22 between the line patterns of the first film 21 as illustrated in FIG. 1B.

The second film 31 includes silicon and oxygen and is formed according to the plasma processing using a gas including silicon (Si) and oxygen (O).

For example, a mixture of gases including $SiCl_4$, $O_2$, and HBr is introduced into the chamber 62 and the second film 31 is formed as an inorganic film mainly including Si, O, and Br.

Then, the second film 31 is etched back by plasma processing using a gas including a fluorocarbon. For example, a mixture of gases including $C_4F_8$, CO, Ar, and $O_2$ is introduced into the chamber 62 and the second film 31 is etched back toward the substrate or the film 10 to be processed in a vertical orientation to result in the structure of FIG. 1C.

The underlying layer 11 that is a silicon nitride film works as an etch stop film here and is not etched away by the etching environment in the chamber 62.

The gas species used for this etching may include selectivity to the first film (resist film) 21 and to the underlying film (silicon nitride film) 11; for example, a gas mixture including $C_4F_6$, $C_5F_8$, Ar, and $O_2$ can be used.

Figure 1C:
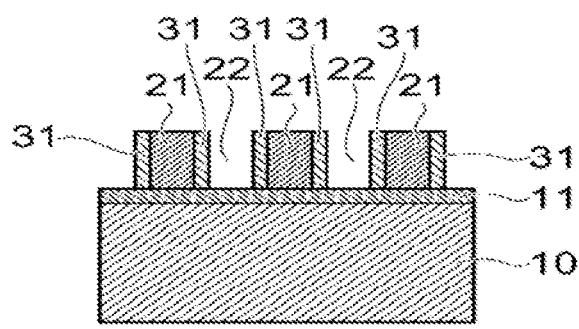

According to the etch-back of the second film 31, the second film 31 on the top surface of the underlying layer 11, as well as the second film 31 on the top surface of the first film 21, are eliminated as illustrated in FIG. 1C. The top surface of the first film 21 is exposed. The second film 31 remains on the sidewalls of the first film 21.

The patterned lines (or other features) of the first film 21 work as a core film for aligning the second film 31 with the sidewalls of the patterned lines after the etch step. Next, the patterned lines of the first film 21 are etched and eliminated.

For example, a gas including $O_2$ is introduced into the chamber 62 and the first film 21 that is a resist film is asked (reactively removed) by oxygen radicals.

The underlying layer 11 that is a silicon nitride film works as an etch stop film here and is not etched away.

Figure 1D:
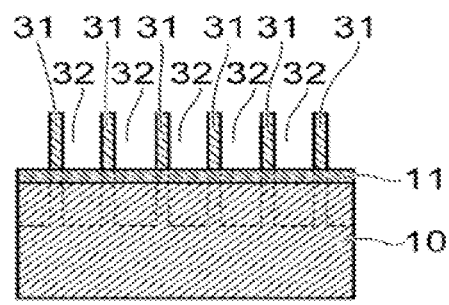

Once the first film 21 is removed, as illustrated in FIG. 1D, a line and space pattern including the several line patterns of the second film 31 remains on the underlying layer 11.

The width of the line pattern of the second film 31 is less than the width of the line pattern of the first film 21 obtained according to the lithography using the aligner. Accordingly, in this stage, when the film 10 to be processed is etched with the line pattern of the second film 31 used as a mask, the film 10 to be processed can be processed into a subsequent line pattern having the line width as indicated by a dotted line in FIG. 1D. The subsequent line pattern thus includes a line width that is less than the resolution limit of the aligner (stepper) and has about half pitch of the pitch of the line and space pattern of the first film (resist film) 21.

In the first embodiment, the line pattern of the second film 31 is formed and it is then used as the core film, to establish the spacing and position of a further pattern.

Figure 2A:
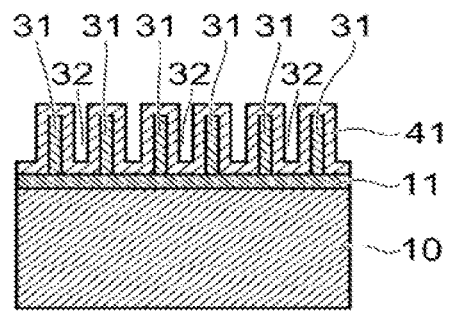

Namely, as illustrated in FIG. 2A, a third film 41 is deposited. The third film 41 is conformably deposited on the top surface of the underlying layer 11 between the portions of the patterned second film 31, and the sidewall and the top surface of the patterned second film 31. The film thickness of the third film 41 is less than the width of the space 32 between the patterned lines of the second film 31.

Via plasma processing using a gas including carbon (C), the third film 41 including carbon is formed. For example, via plasma processing using a $CH_4$ gas, the third film 41 is formed as a carbon film.

Next, for example, by plasma processing using a gas including $H_2$, $N_2$, and $O_2$, the third film 41 is etched back. The third film 41 is etched back toward the substrate or the film 10 to be processed in a vertical orientation resulting in the structure of FIG. 2B.

The underlying layer 11 that is a silicon nitride film works as an etch stop film here and it is minimally etched.

Figure 2B:
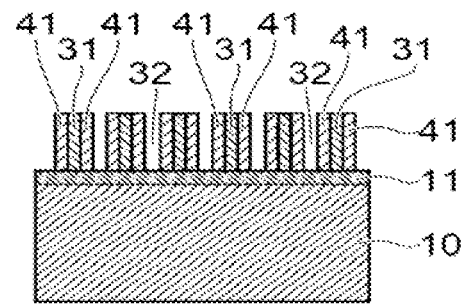

According to the etch-back of the third film 41, the third film 41 on the top surface of the underlying layer 11 and the third film 41 on the top surface of the second film 31 are eliminated, as illustrated in FIG. 2B. The top surface of the second film 31 is exposed. The third film 41 remains on the sidewalls of the second film 31.

The film thickness of the third film 41 left on the sidewall of the second film 31 is controlled to be substantially equal to the line width of the second film 31. Further, the film thickness of the third film 41 left on the sidewall of the second film 31 is controlled to be substantially about ⅓ of the width of the space 32 between the line patterns of the second film 31.

The second film 31 works as a core film supporting the third film 41 remaining on the sidewalls. Next, the second film 31 is etched and eliminated.

For example, through the plasma processing using a mixture gas including $C_4F_8$, CO, Ar, and $O_2$, the second film 31 is etched and removed.

The underlying layer 11 that is a silicon nitride film works as an etch stop film here and is minimally etched.

Figure 2C:
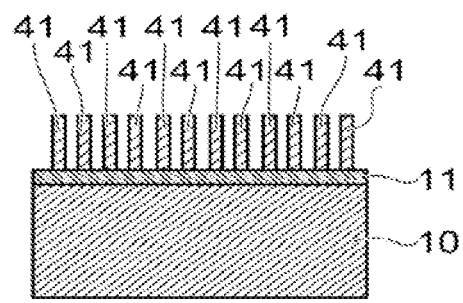

By eliminating the second film 31, a line and space pattern including the several line patterns of the third film 41 remains on the underlying layer 11, as illustrated in FIG. 2C.

Figure 2D:
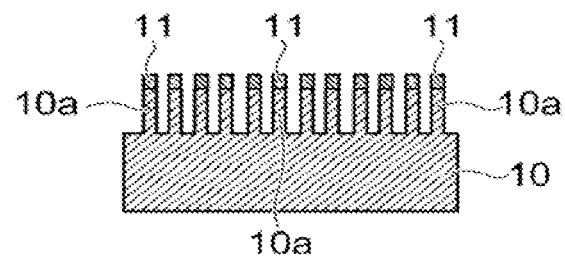

Then, by etching using the third film 41 as a mask, the underlying layer 11 and the film 10 to be processed are sequentially processed, resulting in the structure as illustrated in FIG. 2D. When dry plasma etching is used, the underlying layer 11 and the film 10 to be processed can be sequentially processed within the same chamber 62 (shown in FIG. 7).

Alternatively, wet etching can be used depending on the material of the film 10 to be processed. In this case, after the process of FIG. 2C, the wafer is transferred out of the chamber 62 and transferred to a wet etching device.

In a line and space pattern including the plurality of line patterns of the third film 41, a ratio of line width and space width is almost one to one. Further, the pitch of the line and space pattern of the third film 41 is about ¼ of that of the line and space pattern of the first film (resist film) 21 shown in FIG. 1A.

Using the line and space pattern of the third film 41 as a mask, a line and space pattern including a plurality of line patterns 10a is formed on the film 10 to be processed.

Therefore, a line and space pattern having a pitch that is about ¼ of the pitch of the line and space pattern of the first film (resist film) 21 can be formed on the film 10 to be processed. More specifically, a line and space pattern having a fine pitch that is less than the resolution limit of the aligner can be formed on the film 10 to be processed.

The sidewall process according to the embodiment can be applied to, for example, the processing of a memory cell. For example, the sidewall process according to the embodiment can be applied for processing into a line and space pattern for a stacked body including a floating electrode, a stacked body including a charge trap film, and a stacked body including a variable resistance film.

According to the embodiment, a series of the processes shown in FIGS. 1B to 2C can be performed within the same chamber 62 of one plasma processor 60 (shown in FIG. 7), after the line and space pattern of the first film (resist film) 21 is formed according to the lithography and the developing processes. Here, a series of the processes shown in FIGS. 1B to 2C is sequentially performed as a dry process using plasma, under an atmosphere having a desired pressure, without being exposed to the air.

Further, after a series of processes shown in FIGS. 1B to 2C, additional processing by applying even thinner conformal layers, anisotropic etching of the layers with a chemistry selective to the conformal layer, followed by removal of the prior line feature functioning as a core, may be undertaken. Then the subsequent line and space pattern is used as a mask, and the underlying layer 11 and the film 10 to be processed as shown in FIG. 2D can be etched. According to this, a line and space pattern having a further finer pitch, such as ⅛ and ¹⁄₁₆ of the pitch of the line and space pattern of the first film (resist film) 21, can be formed. In this case, the film thickness and the formation position of the initial core film (original patterned lines) and the sidewall film should be adjusted in size in the respective sidewall processes depending on the finally formed line and space pattern.

The plasma processor 60 of the embodiment is, for example, a plasma etching device. Due to the miniaturization of the pattern size, a thick film does not have to be formed as the sidewall film. Further, since the sidewall film is eliminated after it is used as the mask and it is not a functional element of the final device, the sidewall film does not have to be a permanent film. Therefore, the plasma etching device can efficiently deposit a film suitable for a sidewall film used for the sidewall process.

By properly combining the materials of the underlying film, the core film, and the sidewall film, a series of processes including deposition of the sidewall film, etch-back of the sidewall film, and elimination of the core film can be performed within the same device, without removing a wafer from the supporting base within the chamber.

Accordingly, there is no need to transfer a wafer from one device (chamber) and into another device (chamber) in every process of deposition of a sidewall film (the second film 31 and the third film 41), etch-back of the sidewall film (the second film 31 and the third film 41), and elimination of the core film (the first film 21 and the second film 31), thereby simplifying the process and shortening the processing time. Further, in order to do a series of the processes, including deposition of a sidewall film, etch-back of the sidewall film, and elimination of a core film, only one device is used, thereby minimizing the cost of investment in equipment. Thus, the manufacturing cost can be minimized and a low-cost product can be provided.

Second Embodiment

FIGS. 3A to 4E are schematic cross-sectional views showing a method of manufacturing a semiconductor device according to a second embodiment.

Figure 3A:
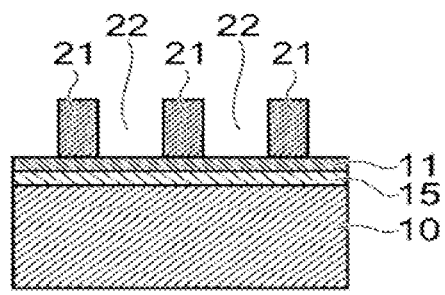
FIGS. 3A to 4E are schematic cross-sectional views showing a method of forming a semiconductor device according to a second embodiment.

In the second embodiment, as shown in FIG. 3A, an underlying film 15 (overlying the film 10, but underlying the materials used to form a mask herein) is formed on the film 10 to be processed as a first underlying film and an underlying layer 11 is formed over the underlying film 15 as a second underlying film.

In this embodiment, the underlying layer 11 is a silicon nitride film, similarly to the first embodiment and the underlying film 15 is, for example, a silicon film, different from the type of the underlying layer 11.

Hereinafter, the operation proceeds in the same way as in the first embodiment, up to the process shown in FIG. 3D.

Namely, a line and space pattern including a plurality of line patterns of the first film (resist film) 21 is formed on the underlying layer 11, as illustrated in FIG. 3A.

Next, a wafer is transferred into the chamber 62 of the plasma processor 60 and mounted on the supporting base 63 (shown in FIG. 7).

Figure 3B:
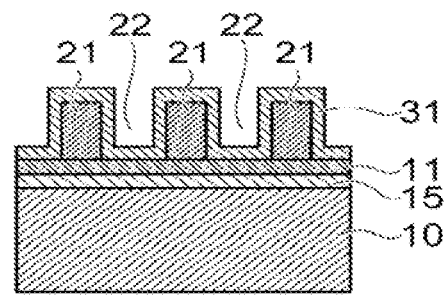

As illustrated in FIG. 3B, the second film 31 is conformally deposited over the patterned resist film 21. The second film 31 is conformably deposited on the top surface of the underlying layer 11 and the sidewall and the top surface of the first film 21.

For example, a gas mixture including $S_tCl_4$, $O_2$, and HBr is introduced into the chamber 62 and the second film 31 is formed as an inorganic film mainly including Si, O, and Br.

Then, the second film 31 is etched back by plasma processing using a gas including fluorocarbon. The underlying layer 11 that is a silicon nitride film works as an etch stop film here and is not etched away.

Figure 3C:
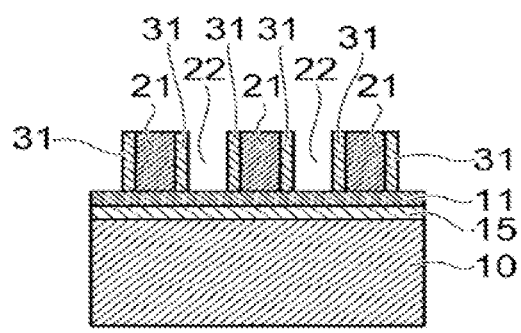

By the etch-back of the second film 31, the second film 31 on the top surface of the underlying layer 11 and the second film 31 on the top surface of the first film 21, between the line pattern of patterned first film 21 are eliminated, as illustrated in FIG. 3C. The top surface of the first film 21 is exposed. The second film 31 remains on the sidewalls of the first film 21.

Next, the first film 21 is etched away and thus eliminated. For example, a gas including $O_2$ is introduced into the chamber 62, where the first film 21 that is a resist film is asked by a plasma of oxygen radicals.

The underlying layer 11 that is a silicon nitride film works as an etch stop film here and is minimally etched.

Figure 3D:
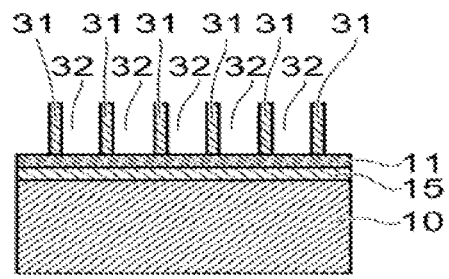

By eliminating the first film 21, a line and space pattern including the plurality of line patterns of the second film 31 remains on the underlying layer 11, as illustrated in FIG. 3D.

Figure 4A:
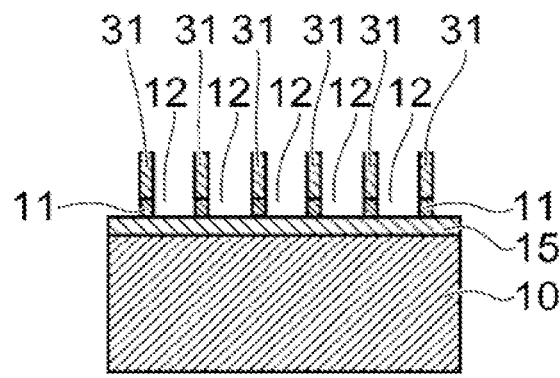

Thereafter, in the second embodiment, the underlying layer 11 may be processed by being etched using the line patterns of the second film 31 as a mask, as illustrated in FIG. 4A.

For example, through the plasma processing using a gas mixture including $CH_3F$, Ar, and $O_2$, the underlying layer 11 that is a silicon nitride film is etched.

The underlying film 15 that is a silicon film works as an etch stop film here and is minimally etched.

Next, the second film 31 remaining on the underlying layer 11 is etched and eliminated through the plasma processing using a gas mixture, for example, including $C_4F_8$, CO, Ar, and $O_2$. The underlying film 15 works as an etch stop film and is minimally etched.

A line and space pattern including the plurality of line patterns of the underlying layer 11 remains on the underlying film 15. The sidewall process using the underlying layer 11 as the core film will be further continued in the following processes.

Figure 4B:
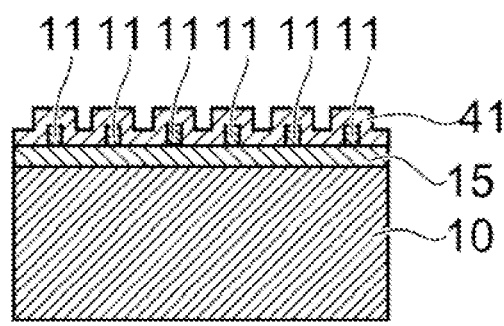

Namely, as illustrated in FIG. 4B, the third film 41 is deposited. The third film 41 is conformably deposited on the top surface of the underlying film 15 and the sidewall and the top surface of the underlying layer 11. The film thickness of the third film 41 is smaller than the width of the space between the line patterns of the underlying layer 11.

For example, through the plasma processing using a $CH_4$ gas, the third film 41 is formed as a carbon film.

Next, for example, by plasma processing using a gas including $H_2$, $N_2$, and $O_2$, the third film 41 is etched back. The underlying film 15 that is a silicon film works as an etch stop film here and is minimally etched.

Figure 4C:
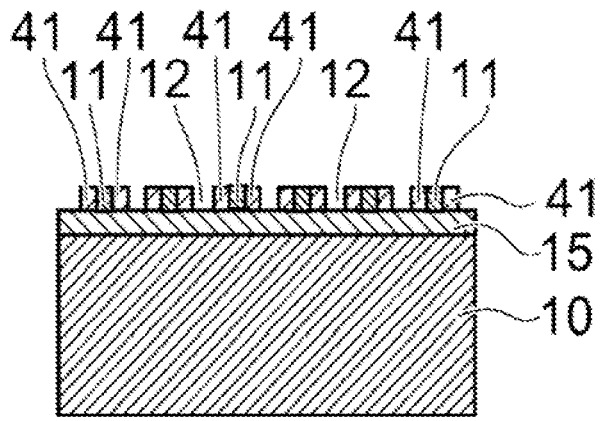

According to the etch-back of the third film 41, the third film 41 on the top surface of the underlying film 15 and the third film 41 on the top surface of the underlying layer 11 are removed, as illustrated in FIG. 4C. The top surface of the underlying layer 11 is exposed. The third film 41 remains on the sidewalls of the underlying layer 11.

The film thickness of the third film 41 remaining on the sidewalls of the underlying (core) layer 11 is controlled to be substantially equal to the line width of the underlying layer 11. Further, the film thickness of the third film 41 remaining on the sidewall of the underlying layer 11 is controlled to be substantially ⅓ of the width of the space between the line patterns of the underlying layer 11.

Next, for example, through the plasma processing using a gas mixture including $CH_3F$, Ar, and $O_2$, the underlying layer 11 is etched and eliminated. The underlying film 15 that is a silicon film works as an etch stop film here and is minimally etched.

Figure 4D:
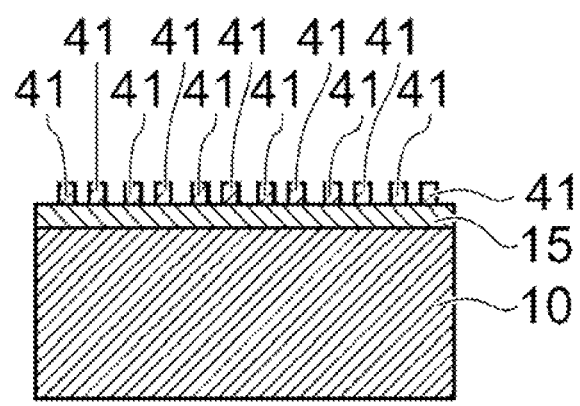

By eliminating the underlying layer 11 that is the core film, a line and space pattern including the plurality of line patterns of the third film 41 remains on the underlying film 15, as illustrated in FIG. 4D.

Figure 4E:
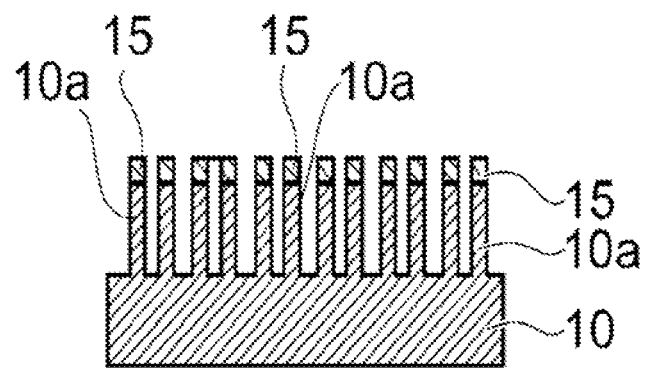

Thereafter, as illustrated in FIG. 4E, the underlying film 15 and the film 10 to be processed are sequentially processed by being etched using the third film 41 as a mask. When a dry plasma etching is used, the underlying film 15 and the film 10 to be processed can be sequentially processed within the same chamber 62 (shown in FIG. 7).

Alternatively, a wet etching may be applied, depending on the material of the film 10 to be processed. In this case, after the process of FIG. 4D, the wafer is transferred out of the chamber 62 and transferred in to a wet etching device.

In the line and space pattern including the plurality of line patterns of the third film 41, the ratio of the line width and the space width is almost one to one. Further, the pitch of the line and space pattern of the third film 41 is about ¼ of the pitch of the line and space pattern of the first film (resist film) 21 illustrated in FIG. 3A.

A line and space pattern including the plurality of line patterns 10a is formed on the film 10 to be processed by etching using the line and space pattern of the third film 41 as a mask.

Accordingly, a line and space pattern having a pitch that is about ¼ of the pitch of the line and space pattern of the first film (resist film) 21 (illustrated in FIG. 3A) can be formed on the film 10 to be processed. More specifically, a line and space pattern of a fine pitch that is less than the resolution limit of the aligner (stepper) can be formed on the film 10 to be processed.

According to the second embodiment, a series of the processes shown in FIGS. 3B to 4D, after forming the line and space pattern of the first film (resist film) 21 according to the lithography and the developing processing, can be performed all within the same chamber 62 of one plasma processor 60.

More specifically, after the process shown in FIG. 3A, a process target wafer is transferred into the chamber 62 of the plasma processor 60. Then, with the wafer mounted on the supporting base 63 within the chamber 62, a series of the processes shown in FIGS. 3B to 4D is sequentially performed as a dry process using plasma, in an atmosphere having a desired pressure, without being exposed to the air.

According to the second embodiment, a series of the processes including deposition of the second film 31, etch-back of the second film 31, elimination of the first film 21, processing of the underlying layer 11, elimination of the second film 31, deposition of the third film 41, etch-back of the third film 41, and elimination of the underlying layer 11 may be sequentially performed within the same chamber 62.

There is no need to transfer a wafer from one device into another device in every process, thereby simplifying the process and shortening the processing time. Further, in order to do a series of the processes including deposition of a sidewall film, etch-back of the sidewall film, and elimination of a core film, only one device is necessary, thereby minimizing the cost of investment in equipment. Thus, the manufacturing cost can be minimized and a low-cost product can be provided.

Further, according to the second embodiment, the underlying layer 11 is processed by being etched using the mask of the line pattern of the second film 31 shown in FIG. 3D formed by the first sidewall process. Specifically, by once transferring the sidewall pattern formed by the first sidewall process to the underlying layer 11, a pattern can be formed on the underlying layer 11 in a such a way so as to reduce any asymmetric in the sidewall pattern formed in the first sidewall process. Therefore, the embodiment advantageously controls dimensions of the line pattern 10a finally formed on the film 10 to be processed after passing through the second sidewall process using the pattern of the underlying layer 11 as the core film.

Third Embodiment

FIGS. 5A to 6D are schematic cross-sectional views showing a method of manufacturing a semiconductor device according to a third embodiment.

Figure 5A:
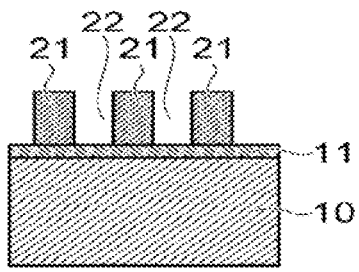
FIGS. 5A to 6D are schematic cross-sectional views showing a method of forming a semiconductor device according to a third embodiment.

Similarly to the above-mentioned embodiment, as illustrated in FIG. 5A, the underlying layer 11 is formed on the film 10 to be processed and a line and space pattern, including a plurality of line patterns of the first film (resist film) 21, is formed on the underlying layer 11.

In the third embodiment, the width of the line pattern of the first film 21 is substantially equal to the width of the space 22 between the line patterns of the first film 21. Namely, the ratio of the line and the space is almost one to one.

Then, a wafer with the line and space pattern of the first film 21 formed thereon is transferred into the chamber 62 of the plasma processor 60 and mounted on the supporting base 63 (shown in FIG. 7).

Figure 5B:
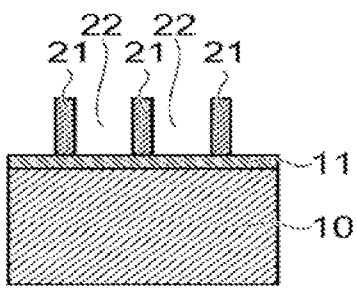

The first film 21 is isotropically etched within the chamber 62, for example, through the plasma processing using a gas including $O_2$. The first film 21 is reduced in width, as illustrated in FIG. 5B. Namely, the first film 21 is reduced in width (trimmed) from the state shown in FIG. 5A formed by the lithography to the state shown in FIG. 5B. The line width of the trimmed first film 21 becomes about ⅓ of the space 22 between the line patterns.

Sequentially, a second sidewall process will be repeated within the same chamber 62, similar to the above-mentioned embodiment. Similar to the state indicated by the dotted line in FIG. 1D, the film 10 to be processed may be processed using the line and space pattern obtained after the first sidewall process as a mask.

Figure 5C:
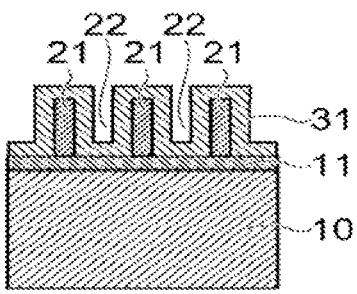

As illustrated in FIG. 5C, the second film 31 is deposited. The second film 31 is conformably deposited on the top surface of the underlying layer 11 as well as the sidewall and the top surface of the first film 21. The film thickness of the second film 31 is controlled to be substantially equal to the width of the line pattern of the first film 21.

Figure 5D:
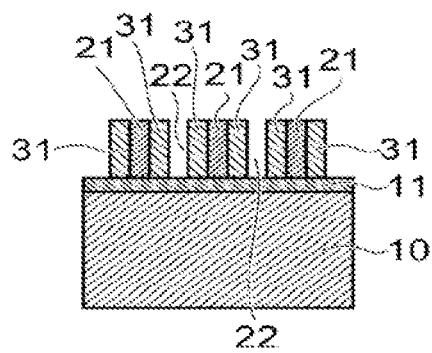

Next, the second film 31 is etched back through the plasma processing. The second film 31 on the top surface of the underlying layer 11 and the second film 31 on the top surface of the first film 21 are eliminated, as illustrated in FIG. 5D. The top surface of the first film 21 is exposed. The second film 31 remains on the sidewalls of the first film 21.

Next, the first film 21 that is a resist film is eliminated through the plasma processing (asking) using a gas including $O_2$. The underlying layer 11 that is a silicon nitride film works as an etch stop film here and is minimally etched.

Figure 6A:
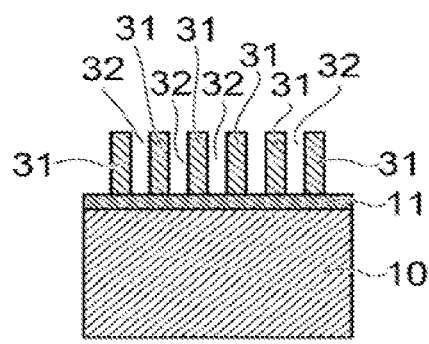

By eliminating the first film 21, a line and space pattern including the plurality of line patterns of the second film 31 remains on the underlying layer 11, as illustrated in FIG. 6A.

The width of the line pattern of the second film 31 is less than the width of the line pattern of the first film 21 illustrated in FIG. 5A obtained by the lithography using the aligner. Further, the width of the line pattern of the second film 31 is substantially equal to the width of the space 32 between the line patterns. Namely, the line and space pattern of the second film 31 with a one to one ratio of the line and the space is formed on the underlying layer 11.

Figure 6B:
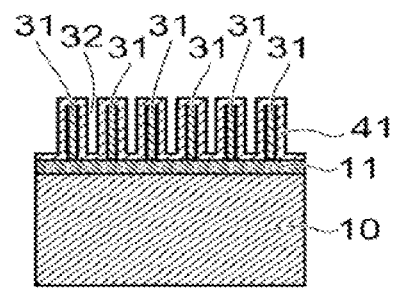

Next, the second film 31 is isotropically etched, for example, through the plasma processing using a gas including fluorocarbon. The second film 31 is reduced in width, as illustrated in FIG. 6B. Namely, the second film 31 is reduced in width from the state shown in FIG. 6A. The line width of the trimmed second film 31 becomes about ⅓ of the space 32 between the line patterns.

Then, the third film 41 is deposited. The third film 41 is conformably deposited on the top surface of the underlying layer 11 and the sidewall of the second film 31 and the top surface thereof. The film thickness of the third film 41 is controlled to be substantially equal to the width of the patterned lines of the second film 31.

Next, the third film 41 is etched back through the plasma processing. The underlying layer 11 works as an etching stopper film here and is not etched away.

Figure 6C:
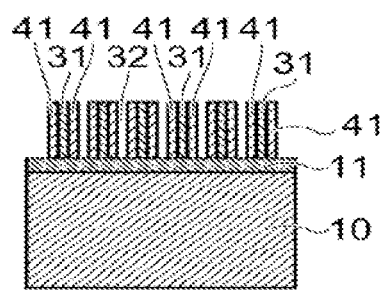

By the etch-back of the third film 41, the third film 41 on the top surface of the underlying layer 11 and the third film 41 on the top surface of the second film 31 are eliminated, as illustrated in FIG. 6C. The top surface of the second film 31 is exposed. The third film 41 remains on the sidewalls of the second film 31.

Next, the second film 31 is etched away and thus eliminated through the plasma processing. The underlying layer 11 that is a silicon nitride film works as an etching stopper film here and is not etched away.

Figure 6D:
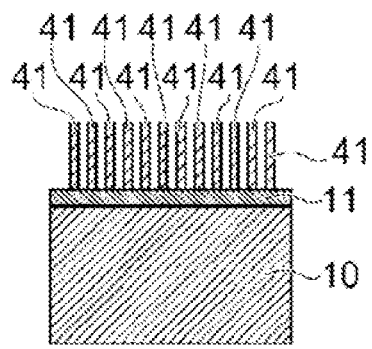

By eliminating the second film 31, a line and space pattern including a plurality of line patterns of the third film 41 remains on the underlying layer 11, as illustrated in FIG. 6D.

Similar to the above-mentioned embodiment, the underlying layer 11 and the film 10 to be processed are sequentially processed by etching using the third film 41 as a mask.

In the line and space pattern of the third film 41, the ratio of the line width and the space width is almost one to one. Further, the pitch of the line and space pattern of the third film 41 is about ¼ of the pitch of the line and space pattern of the first film (resist film) 21 shown in FIG. 5A.

After the process shown in FIG. 6D, if another sidewall process is performed, using the same material of the core film and the sidewall film as that in a series of the processes shown in FIGS. 5B to 6A, and a series of the processes shown in FIGS. 6B to 6D and the underlying layer 11 and the film 10 to be processed are performed, hence to transfer the pattern, a line and space pattern having a further finer pitch, that is, ⅛ and 1/16 of the pitch of the line and space pattern of the first film (resist film) 21 can be formed. Accordingly, a line and space pattern with a finer pitch that is less than the resolution limit of the aligner can be formed on the film 10 to be processed. Especially, in the third embodiment, since the core film is reduced in each sidewall process, even in the case of forming a line and space pattern having whatever pitch, controllability of the line pattern position of a line and space pattern is improved by adjusting the slimming amount.

According to the third embodiment, a series of the processes shown in FIGS. 5B to 6D, after forming the line and space pattern of the first film (resist film) 21 according to the lithography and the development processing, can be performed within the same chamber 62 of one plasma processor 60.

Namely, after the process shown in FIG. 5A, the process target wafer is transferred into the chamber 62 of the plasma processor 60. With the wafer mounted on the supporting base 63 within the chamber 62, a series of the processes shown in FIGS. 5B to 6D is sequentially performed as a dry process using plasma, without being exposed to the air, under an atmosphere at a desired pressure.

There is no need to transfer a wafer from one device into another device in every process of reducing of the core film (the first film 21 and the second film 31), deposition of the sidewall film (the second film 31 and the third film 41), etch-back of the sidewall film (the second film 31 and the third film 41), and elimination of the core film (the first film 21 and the second film 31), thereby simplifying the process and shortening the processing time. Further, in order to do a series of the processes including reduction of the core film, deposition of the sidewall film, etch-back of the sidewall film, and elimination of the core film, only one device is necessary, thereby minimizing the cost of investment in equipment. Thus, the manufacturing cost can be minimized and a low-cost product can be provided.

In the above-mentioned embodiment, a series of processes in the sidewall process is performed within the same chamber 62, hence to realize very efficient processing. The above embodiment has been described in the case where the sidewall process including deposition of the sidewall film, etch-back of the sidewall film, and elimination of the core film is repeated twice (or more than two times) within the same chamber 62. However, while sequentially performing the series of the sidewall processes including deposition of the sidewall film, etch-back of the sidewall film, and elimination of the core film in each sidewall process within the same chamber 62, the wafer may be transferred out from the chamber 62 once during the several sidewall processes where a process for measuring the size of the features may be performed outside of the device.

Alternatively, deposition and etching (etch-back) of a film may be performed in another chamber within the same plasma processor. For example, using a device based on the plasma etching device having a plurality of chambers to process the wafer, the deposition of a film and the etching (etch-back) of a film may be separately performed within the different chambers.

Figure 8:
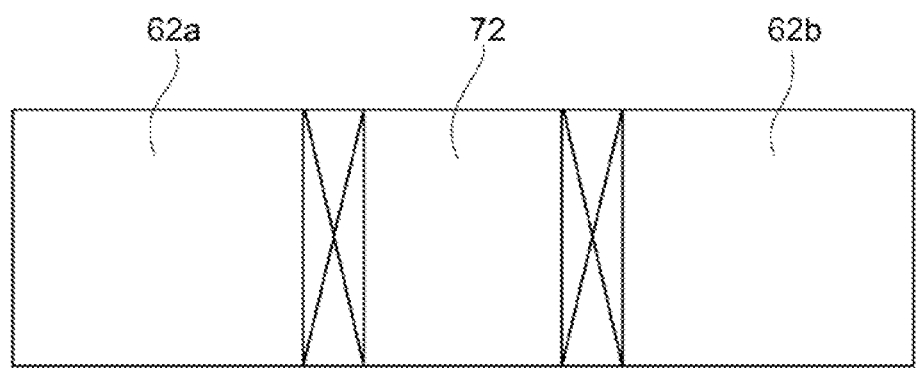
FIG. 8 is a schematic cross-sectional view showing the manufacturing device for manufacturing a semiconductor device according to embodiments described herein.

FIG. 8 shows a plasma processor having two chambers 62a and 62b that are connected through a vacuum transfer system 72. During the processing of a wafer, the two chambers 62a and 62b and the vacuum transfer system 72 are shut down from the air (ambient atmosphere) and are maintained to have an atmosphere having a desired pressure.

For example, after the sidewall film is deposited within the chamber 62a, the wafer is transferred from the chamber 62a to the chamber 62b through the vacuum transfer system 72. Etch-back of the sidewall film and elimination of the core film are performed within the chamber 62b. The wafer is transferred within the same device under a desired decompressed atmosphere, without getting out of the plasma processor including the two chambers 62a and 62b and the vacuum transfer system 72 (without being exposed to the air).

Also in this case, only one device is necessary, to do a series of the processes including deposition of a sidewall film, etch-back of the sidewall film, and elimination of the core film, thereby reducing the cost of investment in equipment. Further, the processing time can be shortened as the wafer is not transferred multiple times to different devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device in a plasma processing device, the method comprising:
   a) forming a first line and space pattern above a substrate, the first line and space pattern comprising a first film;
   b) depositing a second film on a sidewall and a top surface of the first film;
   c) removing the second film from the top surface of the first film and leaving the second film on the sidewall of the first film; and
   d) removing the first film to form a second line and space pattern comprising the second film and having a finer pitch than the first line and space pattern, wherein steps b-d are performed without removing the substrate from the plasma processing device.

2. The method of claim 1, wherein the plasma processing device comprises a first chamber and a second chamber connected by a vacuum transfer system, the method further comprising:
   performing step b in the first chamber of the plasma processing device;
   transferring the substrate to the second chamber through the vacuum transfer system; and
   performing step c in the second chamber.

3. The method of claim 1, wherein the plasma processing device comprises a first chamber and a second chamber connected by a vacuum transfer system, the method further comprising:
   performing step b in the first chamber of the plasma processing device;
   transferring the substrate to the second chamber through the vacuum transfer system; and
   performing steps c-d in the second chamber.

4. The method of claim 1, wherein steps b-d are performed in the same chamber of the plasma processing device.

5. The method of claim 1, wherein the first film comprises carbon.

6. A method of manufacturing a semiconductor device, the method comprising:
   forming a first line pattern comprising a first film above an underlying layer;
   depositing a second film on a sidewall and a top surface of the first line pattern of the first film;
   etching the second film to eliminate the second film on the top surface of the first line pattern of the first film and leave the second film on the sidewall of the first line pattern of the first film; and
   removing the first line pattern to form a second line pattern of the second film above the underlying layer, wherein depositing of the second film, etching of the second film, and removing of the first line pattern are sequentially performed within the same plasma processing device.

7. The method of claim 6, further comprising:
   depositing a third film on a sidewall and a top surface of the second line pattern of the second film;
   etching the third film to eliminate the third film on the top surface of the second line pattern of the second film and leave the third film on the sidewall of the second line pattern of the second film; and
   removing the second line pattern to form a third line pattern of the third film above the underlying layer, wherein depositing of the third film, etching of the third film, and removing of the second line pattern are sequentially performed within the same plasma processor.

8. The method of claim 7, further comprising:
   trimming the second film after removing of the first line pattern.

9. The method of claim 8, wherein
depositing of the second film, etching of the second film, removing of the first line pattern, and isotropically etching of the second film are sequentially performed within the same plasma processing device.

10. The method of claim 7, wherein
the third film includes carbon and is deposited using a plasma of a carbon containing gas.

11. The method of claim 10, wherein
the first film is a resist film including carbon and the first line pattern is formed by exposure and development.

12. The method of claim 10, wherein
the second film includes silicon and oxygen and is deposited using a plasma of a gas containing silicon and oxygen.

13. The method of claim 7, further comprising:
etching the underlying layer using the third line pattern as a mask to transfer the third line pattern to the underlying layer, wherein the third line pattern includes a pitch that is about one-fourth of a pitch of the first line pattern.

14. The method of claim 6, wherein
the second film includes silicon and oxygen and is deposited on the first film using a plasma of a gas containing silicon and oxygen, and
the second film is etched through plasma processing using a gas including fluorocarbon.

15. The method of claim 6, wherein
the first film includes carbon, and
the first line pattern of the first film is removed through plasma processing using a gas including oxygen.

16. The method of claim 6, further comprising:
etching the underlying layer using the second line pattern as a mask to transfer the second line pattern to the underlying layer, wherein the second line pattern includes a pitch that is about half of a pitch of the first line pattern.

17. The method of claim 6, wherein
the underlying layer includes a first underlying film and a second underlying film formed on the first underlying film, the method further comprising:
processing the second underlying film to transfer the second line pattern to the second underlying film by etching using the second line pattern of the second film as a mask;
removing the second line pattern of the second film;
depositing a third film on a sidewall and a top surface of the transferred second line pattern of the second underlying film;
etching the third film to eliminate the third film on the top surface of the transferred second line pattern and leave the third film on the sidewall of the transferred second line pattern; and
removing the transferred second line pattern to form a third line pattern of the third film above the first underlying film, wherein
processing of the second underlying film, removing of the second line pattern, depositing of the third film, etching of the third film, and removing of the transferred second line pattern are sequentially performed within the same plasma processing device.

18. The method of claim 17, wherein
the second underlying film is a silicon nitride film, the first film includes carbon, and
the second film includes silicon and oxygen and is deposited using a plasma of a gas containing silicon and oxygen.

19. The method of claim 18, wherein
the second film is etched through plasma processing using a gas including fluorocarbon, and
the first line pattern of the first film is removed through plasma processing using a gas including oxygen.

20. The method of claim 17, further comprising:
etching the first underlying film using the third line pattern as a mask to transfer the third line pattern to the first underlying film, wherein the third line pattern includes a pitch that is about one-fourth of a pitch of the first line pattern.

* * * * *